(12) United States Patent
Bhagat et al.

(10) Patent No.: US 8,877,596 B2
(45) Date of Patent: Nov. 4, 2014

(54) SEMICONDUCTOR DEVICES WITH ASYMMETRIC HALO IMPLANTATION AND METHOD OF MANUFACTURE

(75) Inventors: Darshana N. Bhagat, Framingham, MA (US); Thomas J. Dunbar, Burlington, VT (US); Yen Li Lim, Essex Junction, VT (US); Jed H. Rankin, Richmond, VT (US); Eva A. Shah, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 12/822,426

(22) Filed: Jun. 24, 2010

(65) Prior Publication Data
US 2011/0316094 A1    Dec. 29, 2011

(51) Int. Cl.
*H01L 21/265* (2006.01)
*H01L 21/8238* (2006.01)
*H01L 29/78* (2006.01)
*H01L 21/425* (2006.01)

(52) U.S. Cl.
CPC .. *H01L 21/26586* (2013.01); *H01L 21/823807* (2013.01); *H01L 29/7833* (2013.01)
USPC ........... 438/302; 438/527; 257/336; 257/408; 257/E21.435; 257/E21.437; 257/E21.443; 257/E29.266; 257/E29.269

(58) Field of Classification Search
CPC .............. H01L 21/823412; H01L 21/823807; H01L 29/66492; H01L 21/26586; H01L 29/7833
USPC .................. 257/336, 408, E21.057, E21.147, 257/E21.443, E21.619, E21.634, E29.266, 257/E29.269, E21.435, E21.059, E21.618, 257/E21.633, E21.437; 438/302, 514, 519, 438/527
See application file for complete search history.

(56) References Cited

U.S. PATENT DOCUMENTS

| | | | | |
|---|---|---|---|---|
| 4,232,439 A | * | 11/1980 | Shibata | 438/302 |
| 5,650,340 A | | 7/1997 | Burr et al. | |
| 5,817,562 A | * | 10/1998 | Chang et al. | 438/305 |
| 5,930,631 A | * | 7/1999 | Wang et al. | 438/286 |
| 6,008,094 A | * | 12/1999 | Krivokapic et al. | 438/286 |
| 6,258,678 B1 | * | 7/2001 | Liaw | 438/303 |
| 6,372,587 B1 | * | 4/2002 | Cheek et al. | 438/302 |
| 6,426,258 B1 | * | 7/2002 | Harada et al. | 438/268 |
| 6,426,262 B1 | * | 7/2002 | Fuselier et al. | 438/276 |
| 6,458,665 B1 | * | 10/2002 | Kim | 438/302 |
| 6,489,223 B1 | * | 12/2002 | Hook et al. | 438/524 |
| 6,624,035 B1 | * | 9/2003 | Luning et al. | 438/302 |
| 6,762,459 B2 | | 7/2004 | Choi et al. | |
| 6,821,830 B2 | * | 11/2004 | Handa et al. | 438/184 |
| 6,833,307 B1 | * | 12/2004 | Wristers et al. | 438/302 |
| 6,916,716 B1 | * | 7/2005 | Goad et al. | 438/276 |
| 7,144,782 B1 | | 12/2006 | Ehrichs | |
| 7,192,836 B1 | * | 3/2007 | Ghaemmaghami et al. | 438/291 |

(Continued)

*Primary Examiner* — Laura Menz
*Assistant Examiner* — Maliheh Malek
(74) *Attorney, Agent, or Firm* — David Cain; Roberts Mlotkowski Safran & Cole, P.C.

(57) ABSTRACT a method comprises forming a hardmask over one or more gate structures. The method further comprises forming a photoresist over the hardmask. The method further comprises forming an opening in the photoresist over at least one of the gate structures. The method further comprises stripping the hardmask that is exposed in the opening and which is over the at least one of the gate structures. The method further comprises removing the photoresist. The method further comprises providing a halo implant on a side of the at least one of the gate structures.

9 Claims, 9 Drawing Sheets

(56) References Cited

U.S. PATENT DOCUMENTS

| | | | |
|---|---|---|---|
| 7,618,867 B2* | 11/2009 | Mono et al. | 438/302 |
| 7,883,909 B2* | 2/2011 | Bernstein | 438/17 |
| 8,003,467 B2* | 8/2011 | Ng et al. | 438/285 |
| 8,362,522 B2* | 1/2013 | Shima | 257/192 |
| 8,482,075 B2* | 7/2013 | Nayfeh et al. | 257/368 |
| 8,518,782 B2* | 8/2013 | Botula et al. | 438/286 |
| 2001/0031522 A1* | 10/2001 | Stolk et al. | 438/199 |
| 2002/0106859 A1* | 8/2002 | Odake et al. | 438/264 |
| 2002/0142546 A1 | 10/2002 | Kouznetsov et al. | |
| 2003/0008484 A1* | 1/2003 | Hook | 438/524 |
| 2004/0219724 A1* | 11/2004 | Park et al. | 438/197 |
| 2007/0145495 A1* | 6/2007 | Curello et al. | 257/402 |
| 2007/0148860 A1* | 6/2007 | Verheyen et al. | 438/255 |
| 2007/0228483 A1* | 10/2007 | Yuda | 257/369 |
| 2008/0096342 A1* | 4/2008 | Sheraw et al. | 438/210 |
| 2008/0311720 A1* | 12/2008 | Hoffman et al. | 438/300 |
| 2009/0325355 A1* | 12/2009 | Poock et al. | 438/302 |
| 2010/0019323 A1* | 1/2010 | Shin | 257/369 |
| 2010/0163939 A1* | 7/2010 | Kronholz et al. | 257/288 |
| 2010/0181618 A1* | 7/2010 | Meunier-Bellard et al. | 257/344 |
| 2010/0330763 A1* | 12/2010 | Freeman et al. | 438/302 |
| 2011/0089499 A1* | 4/2011 | Nayfeh et al. | 257/408 |
| 2011/0201164 A1* | 8/2011 | Chung et al. | 438/229 |
| 2012/0007147 A1* | 1/2012 | Shima | 257/192 |
| 2012/0313153 A1* | 12/2012 | Zhang et al. | 257/288 |

* cited by examiner

SEMICONDUCTOR DEVICES WITH ASYMMETRIC HALO IMPLANTATION AND METHOD OF MANUFACTURE

FIELD OF THE INVENTION

The invention relates to semiconductor structures and methods of manufacture and, more particularly, to semiconductor devices with asymmetric halo implants and methods of manufacturing such devices.

BACKGROUND

Halo implantation is used in CMOS fabrication to suppress punch-through effect, for example. In conventional processes, low energy, low current implantation is carried out at large incident angle so that implanted dopants penetrate underneath the edge of the gate stack. However, the incident angle has geometric restrictions as the devices are scaled. This is due mainly to the pitch between adjacent devices, and the need for a thick photoresist to block the implant from penetrating into undesirable locations of the device.

For example, in conventional fabrication processes, a photoresist is deposited over the structure in order to block penetration of the halo implant into undesirable locations of the device. For this reason, the photoresist must be perfectly aligned with an edge of a gate structure. However, to adequately protect the device with a photoresist, it is necessary to deposit a very thick layer of photoresist, typically on the order of 0.5 to 3 microns thick. This thickness, however, poses many problems.

For example, a thick photoresist causes reflection of the incident beam into an undesirable exposed portion of the device, which becomes even more pronounced when the node shrinks (i.e., the pitch between adjacent devices is small). That is, at smaller nodes, the rate of reflection becomes even more problematic, as the resist is very thick and the implant can very easily bounce off the walls of the resist into undesirable locations of the device.

Also, due to the thick photoresist, it necessary to provide a very large opening in the resist in order to implant the dopant at the required high incident angle. Again, this becomes problematic in smaller nodes in that it is not possible to provide a large enough opening in the resist due to the spacing between adjacent devices. For example, in smaller nodes, the pitch between the devices becomes ever more smaller, which restricts the size of the opening in the resist. For this reason, it may not be possible to provide a large opening needed to perform the high incident angle halo implant. Also, at these smaller nodes, it becomes more difficult, time consuming and costly to properly align the resist with the edge of the device.

Accordingly, there exists a need in the art to overcome the deficiencies and limitations described hereinabove.

SUMMARY

In a first aspect of the invention, a method comprises forming a hardmask over one or more gate structures. The method further comprises forming a photoresist over the hardmask. The method further comprises forming an opening in the photoresist over at least one of the gate structures. The method further comprises stripping the hardmask that is exposed in the opening and which is over the at least one of the gate structures. The method further comprises removing the photoresist. The method further comprises providing a halo implant on a side of the least one of the at least one of the gate structures.

In another aspect of the invention, a method comprises stripping a portion of a hardmask over a gate structure through an opening in a photoresist. The method further comprises providing a halo implant on a side of the gate structure after removing the photoresist.

In yet another aspect of the invention, an intermediate structure comprises a hardmask over one or more gate structures, wherein the hardmask has notches adjacent to exposed gate structures. The structure also includes a halo implant on a side of the exposed gate structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the coplanar waveguide structure (CPW), which comprises the structures of the present invention. In still further embodiments, a method in a computer-aided design system is provided for generating a functional design model of the CPW. The method comprises generating a functional representation of the structural elements of the CPW.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to semiconductor devices with asymmetric halo implants and methods of manufacturing such devices. In aspects of the invention, the method of asymmetrical halo implantation eliminates the need for a thick photoresist hardmask, which causes reflection of the halo implant back into the device during the implantation process. This reflection negatively affects the diffusions of the device and more specifically, can neutralize the dopants of the transistor. For this reason, devices manufactured using the methods of the present invention exhibit improved device performance, e.g., improved Vt control.

In embodiments, the methods of the present invention are scalable to small nodes, despite the ever increasing narrow pitch between transistors. The present invention also minimizes, significantly, the limited CD overlay control due to topography of smaller nodes, e.g., 130 nm and smaller.

The methods of the present invention are varied, and may include deposition of a hardmask, patterning and etching of the hardmask, implanting of the halo on exposed gate structures or, in embodiments, even through the hardmask itself, depending on the material and thickness of the hardmask. In embodiments, the hardmask can be notched to improve angle response, using an anisotropic etch of the hardmask. In embodiments, the hardmask can be, for example, oxide or nitride or combinations thereof, with or without a poly layer. The hardmasks of the present invention have reduced implant permeability, a shorter stack requirement for implant block, which results in improved geometry (compared to larger resist openings), reduced outgassing in ion implanters (reduced variability/FM) and, in embodiments, improved reflectivity uniformity.

It will be understood by those of skill in the art that the processes of the present invention can vary depending on the hardmask materials. For example, the method of the present invention can include, for example, depositing and patterning a single hardmask. In embodiments, a photoresist is deposited on the hardmask and patterned to form openings. The hardmask, exposed by the openings, can be stripped, and an implant can be provided in the exposed devices after the resist is stripped. The remaining portions of the hardmask can then be stripped. In embodiments, the hardmask can be a thin nitride under oxide, with the oxide being provided for implant blocking and the nitride acting as an etch stop. The hardmask can also be an oxide, nitride, oxide and poly or other combinations discussed herein. In embodiments, the hardmask such as, for example, an oxide, can be notched in order to permit a steeper halo implant angle.

Figure 1A:
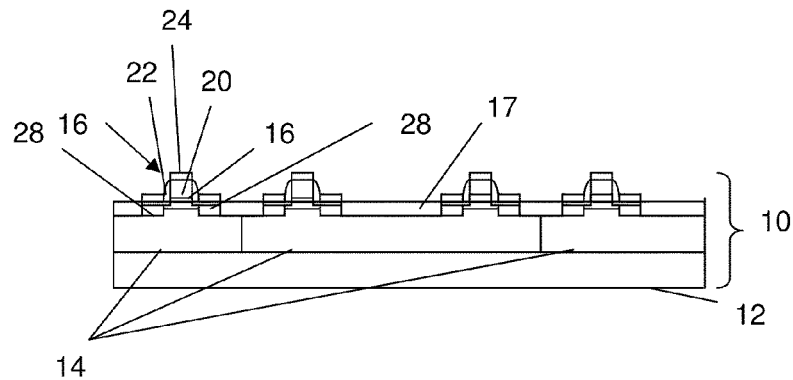
FIGS. 1a-1e show several structures and fabrication steps in accordance with building a device in accordance with aspects of the invention.

FIGS. 1a-1e show several structures and fabrication steps in accordance with building a device in accordance with an aspect of the invention. FIG. 1a is a beginning structure that can be used as the base structure for each of the embodiments described herein. In particular, FIG. 1a shows a beginning structure 10 which includes, for example, a substrate 12 such as, for example, crystalline Si; although, it is contemplated that the substrate 12 can be other materials such as, for example, BOX, SOI, or other substrates well known to those of skill in the art. The substrate 12 includes diffusions 14 such as, for example, P wells and N wells, depending on the particular device parameters. The P wells and N wells are formed using conventional dopants as is known in the art such as, for example, arsenic and phosphorous.

Gate structures 16 are formed on the substrate 12, separated by isolation regions 17 such as, for example, shallow trench isolation (STI) structures made from, for example, oxide or other insulator material. The STI structures 17 can be formed using any conventional processes, depending on the substrate material. For example, in SOI technologies, the STI structures 17 can be part of the original wafer, protected during the formation of the source and drain regions. In Si substrates, the STI structures 17 can be formed using conventional lithographic, etching and oxide deposition processes.

The gate structures 16 include a dielectric material 18 formed on the substrate 12. The dielectric material 18 can be, for example, oxide, Hf, Hf oxide, oxynitride or other materials and combinations thereof to form a dielectric stack. A body 20 of the gate structure is formed on the dielectric material 18 using conventional deposition and etching techniques known to those of skill in the art, such that further explanation is not required herein. The gate body 20 can be made from, for example, poly or metal. Spacers and/or sidewalls 22 and a cap 24 are formed on the gate body 20. The spacers 22 and cap 24 can be formed by, for example, deposition of nitride, as one example. Source regions 26 and drain regions 28 are implanted on sides of the gate structure 16 using conventional implantation processes. The structure of FIG. 1a does not show the halo implantation processes.

Figure 1B:
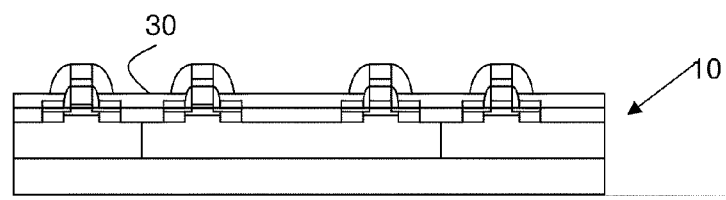

FIG. 1b shows a structure and respective processing steps of an intermediate structure in accordance with the invention. In FIG. 1b, a hardmask 30 is formed on the structure 10 of FIG. 1a. In embodiments, the hardmask 30 can be deposited using conventional deposition methods such as, for example, chemical vapor deposition (CVD), plasma enhanced chemical vapor deposition (PECVD), etc. In embodiments, the hardmask 30 is an oxide material such as, for example, an undensified TEOS material. In embodiments, the oxide may be deposited to a thickness of about 200 nm to 3000 Å and more preferably between about 800 Å and 1000 Å. In an alternate embodiment, the hardmask can be a nitride hardmask deposited to a thickness of about 300 Å and 1000 Å.

Figure 1C:
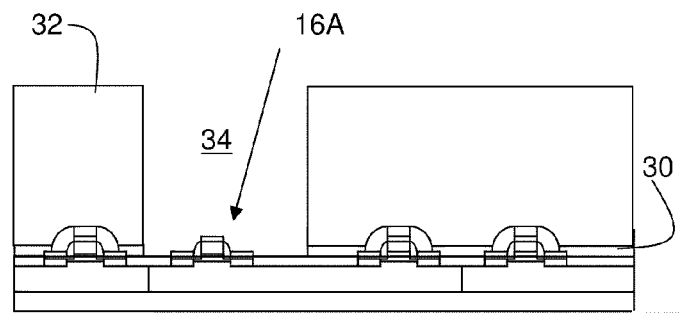

In FIG. 1c, a photoresist 32 is deposited on the hardmask 30. The photoresist 32 is patterned to form an opening 34, in alignment with a gate structure 16A. That is, the opening 34 is over a gate structure 16A. As with each of the embodiments of the present invention, it should be understood by those of skill in the art that more than one opening may be formed in the photoresist 32 for subsequent processing as discussed herein. As such, although only one opening 34 is discussed throughout this disclosure (for ease of explanation), it should be understood that more than one opening can be formed in the photoresist to perform subsequent processes as discussed herein. (See, e.g., FIGS. 5a-5c.) Alignment of this opening is no longer as critical compared to conventional methods, as the many aspects of the invention will not cause any reflections during the halo implantation process.

The patterning of the photoresist 32 can be performed using conventional lithographic and etching processes. After forming the opening 34, the hardmask 30 that is exposed through the opening 34 is etched or stripped using an isotropic etching technique to expose the underlying gate structure 16A.

Figure 1D:
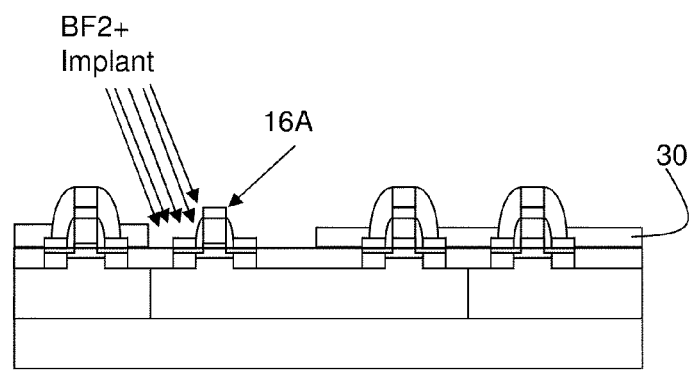

In FIG. 1d, the photoresist is stripped away using any conventional etchant or other known stripping technique. This process leaves behind the hardmask 30 and exposed underlying gate structure 16A. A halo implant of, for example, $Bf_2$, can then be performed on the drain region 28 of the gate structure 16A. As the hardmask 30 is not very thick, compared to a resist used in conventional masking processes, the halo implantation can be performed at a shallower angle, with improved implant concentration. For example, the implant can be performed at an angle less than 45° and more preferably less than 40°. Additionally and advantageously, by using the hardmask 30 of the present invention, the implant will not be reflected back into the structure (as in the conventional structure from using a thick resist), and especially on the source side of the device. This, in turn, improves design performance, as the halo implant for the drain will not affect the source implant.

Figure 1E:
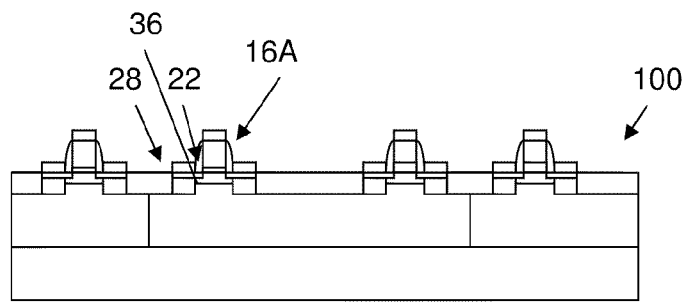

FIG. 1e shows a structure 100 in accordance with aspects of the invention. The structure 100 includes a halo implant 36 at the drain region 28 of the device 16A. In the processing steps of FIG. 1e, the hardmask can be stripped using conventional processes. In embodiments, the STI structures 17 may be slightly recessed during the stripping process, when the hardmask is an oxide. This is due to the selectivity of the etchant to both the oxide hardmask and the oxide forming the STI structures 17. In further embodiments, the slight recess can be avoided when the hardmask is a nitride (or other materials as discussed herein), for example. As should be understood by those of skill in the art, the nitride spacers 22 will not be stripped when using a nitride hardmask, as they also include oxide material.

Figure 2A:
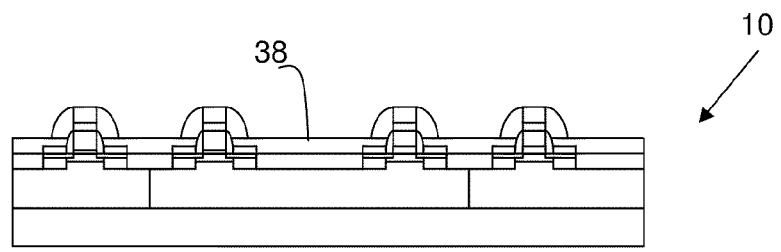
FIGS. 2a-2e show several structures and fabrication steps in accordance with building a device in accordance with aspects of the invention.
Figure 2B:
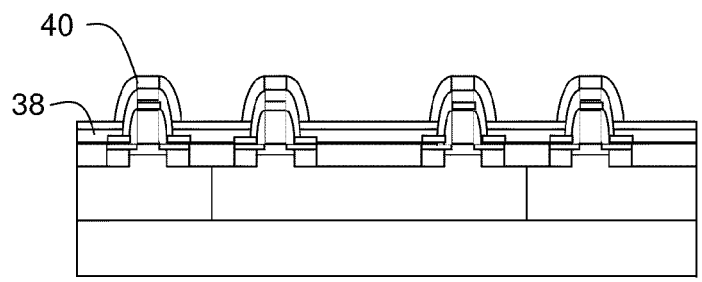

FIGS. 2a-2e show several structures and fabrication steps in accordance with building a device in accordance with aspects of the invention. FIG. 2a starts with the structure 10 shown in FIG. 1a. In addition, a thin layer of first material 38 such as, for example, nitride can be formed on the structure 10. In embodiments, the nitride can be deposited to a depth of about 25 nm to 100 nm. A thin layer of second material 40 (e.g., oxide) is formed on the thin layer of material (e.g., nitride) 38 using conventional deposition processes, for example. In embodiments, the oxide can be, for example, undensified TEOS material deposited to a thickness of about 200 nm to 3000 Å and more preferably between about 800 Å and 1000 Å. In this embodiment, the oxide, for example, can act as an implant blocking material and the nitride can act as an etch stop.

In an alternative embodiment, the first material 38 can be undensified TEOS material, e.g., oxide, deposited to a thickness of about 50 Å and 100 Å and the second material 40 can be a polycrystalline Si deposited to a thickness of about 200 Å to 1500 Å. As should be understood by those of skill in the art, the polycrystalline Si (as the second layer 40) can be easily integrated into the device, and the oxide can be used as an implant stop.

Figure 2C:
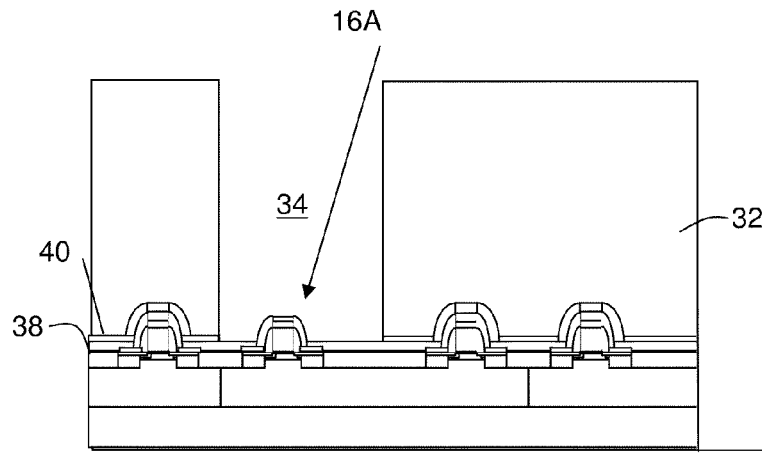

In FIG. 2c, a photoresist 32 is deposited on the hardmask 30. The photoresist 32 is patterned to form an opening 34, in alignment with a gate structure 16A. That is, the opening 34 is over a gate structure 16A. Alignment of this opening is no longer as critical compared to conventional methods, as the many aspects of the invention will not cause any reflections during the halo implantation process. The patterning can be performed using conventional lithographic and etching processes. After forming the opening 34, the second material 40 that is exposed through the opening 34 is etched or stripped using an isotropic etching technique to expose the underlying first material 38.

The etching process as in all embodiments using two layers can be, for example, selective to only the top material. In embodiments, the top layer can act as a hardmask for the stripping of the lower layer. For example, when the hardmask includes a top layer of oxide and a lower layer of nitride, the oxide can first be etched in the opening of the resist. After the resist is stripped, for example, the oxide can act as a hardmask for stripping the nitride over the gate structure. In this embodiment, both the oxide and the nitride over the gate structure 16A will be stripped, prior to halo implant.

Figure 2D:
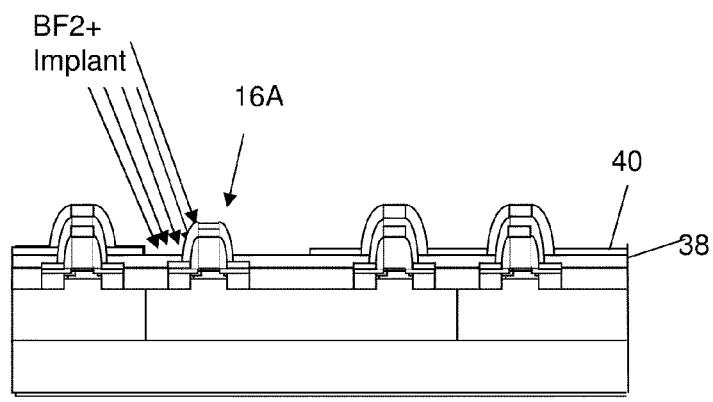

In FIG. 2d, the photoresist is stripped away using any conventional etchant or other known stripping technique. This process leaves behind the exposed first material 38, as well as the now exposed portions of the second material 40, which can protect portions of the device that are not being implanted. A halo implant of, for example, $Bf_2$, can be performed on the drain region 28 side of the gate structure 16A through the first material 38. In embodiments, the implant can easily penetrate, for example, the exposed nitride or oxide material of either embodiment; however, it is contemplated, in embodiments, that the exposed oxide material can also be stripped prior to the implant process. At least the second material 40, though, will protect the remaining device, and will not pose any serious risk of reflection due to the combined height of the first and second materials.

As the combined first material 38 and second material 40 is not very thick, compared to a resist used in conventional masking processes, the halo implantation can be performed at a shallower angle, with improved implant concentration. For example, the implant can be performed at an angle less than 45° and more preferably less than 40°. Additionally and advantageously, by using the first material 38 and second material 40 of the present invention, the implant process will not be reflected back into the structure (as in the conventional structure from using a thick resist), and especially on the source side of the device. This, in turn, will improve design performance, as the halo implant for the drain will not affect the source implant.

Figure 2E:
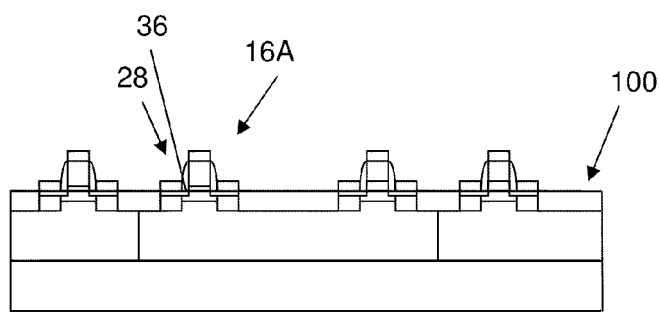

In FIG. 2e, shows a structure 100 in accordance with aspects of the invention. The structure 100 includes a halo implant 36 at the drain region 28 of the device 16A. In the processing steps of FIG. 1e, the hardmask (i.e., first material 38 and second material 40) can be stripped using conventional processes. In embodiments using the material of these embodiments, the STI structures 17 will not be recessed during the stripping process. This is due to the selectivity of the etchant to the lower nitride mask, compared to the oxide forming the STI structures 17. In embodiments, the slight recess can also be avoided using the oxide as a lower mask, since this material is deposited in a very thin layer on the order of 50 Å and 100 Å, for example.

Figure 3A:
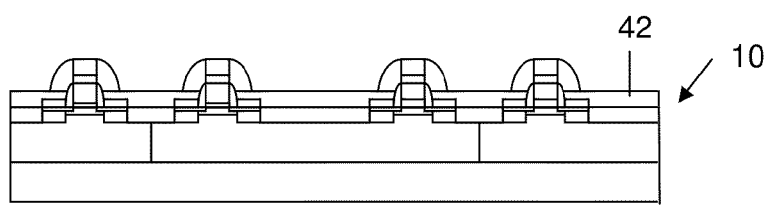
FIGS. 3a-3e show several structures and fabrication steps in accordance with building a device in accordance with an aspect of the invention.

FIGS. 3a-3e show several structures and fabrication steps in accordance with building a device in accordance with an aspect of the invention. FIG. 3a starts with the structure 10 shown in FIG. 1a. In addition, a thin layer of first material 42 such as, for example, oxide can be formed on the structure 10. In embodiments, the oxide can be deposited to a depth of about 100 Å and 300 Å and more preferably 50 Å and 100 Å. The oxide can be, for example, an undensified/low density oxide.

Figure 3B:
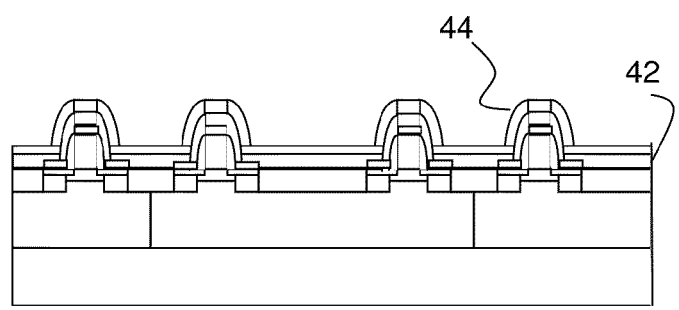

In FIG. 3b, a thin layer of second material 44 (e.g., nitride) is formed on the thin layer of material (e.g., oxide) 42 using conventional deposition processes, for example. In embodiments, the nitride can be, for example, 25 nm to 100 nm.

Figure 3C:
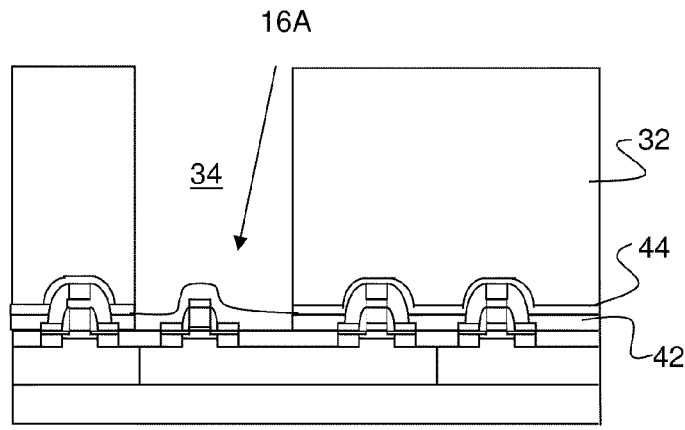

In FIG. 3c, a photoresist 32 is deposited on the second material 44 (e.g., nitride). The photoresist 32 is patterned to form an opening 34, in alignment with a gate structure 16A. That is, the opening 34 is over a gate structure 16A. Alignment of this opening is no longer as critical compared to conventional methods, as the hardmask of the invention will not cause any reflections during the halo implantation process. The patterning can be performed using conventional lithographic and etching processes. After forming the opening 34, the first material 42 that is exposed through the opening 34 is etched or stripped using an isotropic etching technique to expose the underlying gate structure 16A.

Figure 3D:
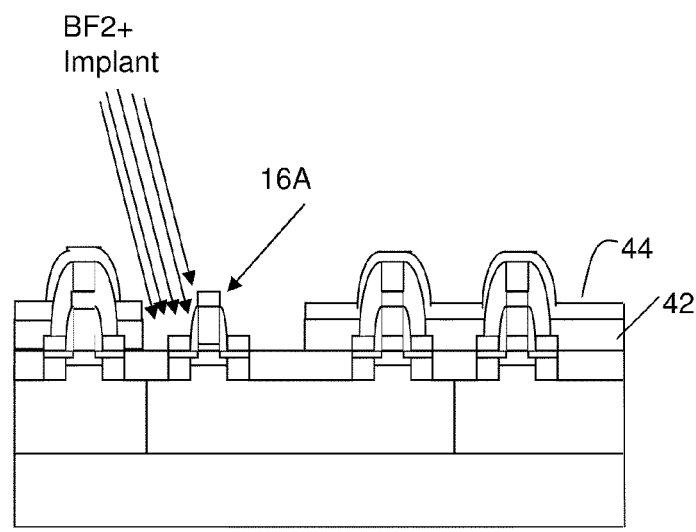

In FIG. 3d, the photoresist is stripped away using any conventional etchant or other known stripping technique. Now, using the second material 44 as a hardmask, it is possible to etch or remove the first material 42 over the gate structure 16A using conventional lithographic and etching processes. Portions of the first material 42, as well as the second material 44 are left behind during this process to protect portions of the device that are not undergoing a halo implant. A halo implant of, for example, $Bf_2$, can then be performed on the drain region 28 side of the exposed gate structure 16A. The first material 42 and second material 44 will protect the remaining device, and will not pose any serious risk of reflection due to the combined height of the first and second materials.

As the combined first material 42 and second material 44 is not very thick, compared to a resist used in conventional masking processes, the halo implantation can be performed at a shallower angle, with improved implant concentration. For example, the implant can be performed at an angle less than 45° and more preferably less than 40°. Additionally and advantageously, by using the first material 42 and second material 44 of the present invention, the implant process at such an angle will not be reflected back into the structure (as in the conventional structure from using a thick resist), and especially on the source side of the device. This, in turn, will improve design performance, as the halo implant for the drain will not affect the source implant.

Figure 3E:
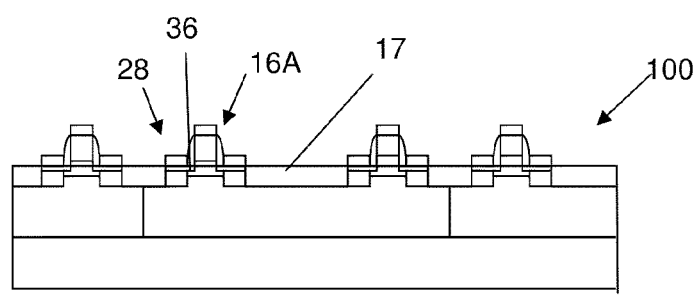

FIG. 3e shows a structure 100 in accordance with aspects of the invention. The structure 100 includes a halo implant 36 at the drain region 28 of the device 16A. In the processing steps of FIG. 1e, the hardmask (i.e., first material 42 and second material 44) can be stripped using conventional processes. In embodiments using the material of these embodiments, the slight recess of the STI structures 17 can be avoided using the oxide as a lower mask, since this material is deposited in a very thin layer on the order of 50 Å and 100 Å, for example.

Figure 4A:
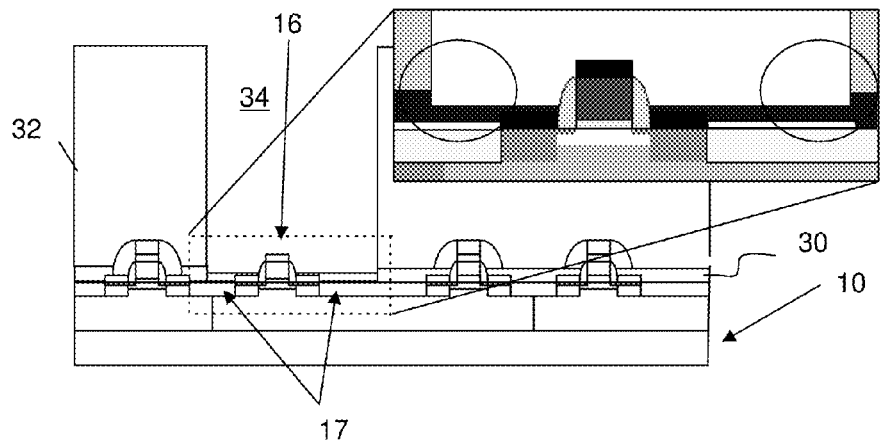
FIGS. 4a-4c show several structures and fabrication steps in accordance with building a device in accordance with an aspect of the invention.
Figure 4B:
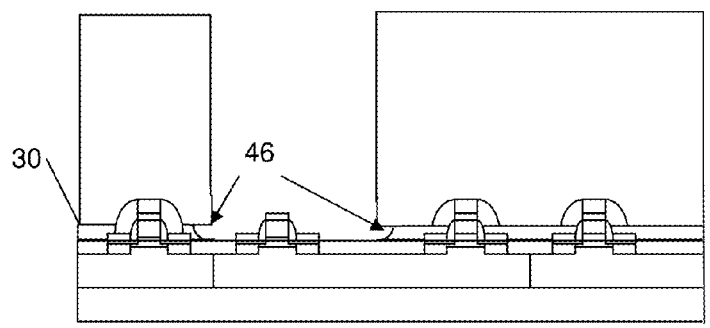
Figure 4C:
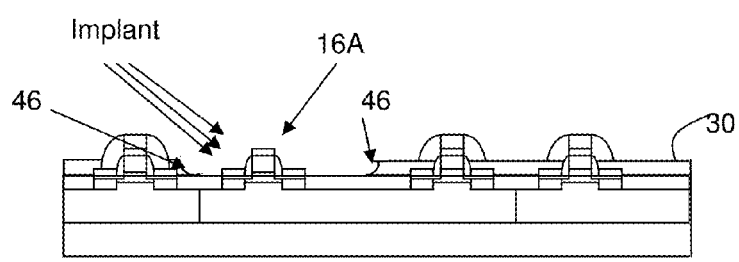

FIGS. 4a-4c show several structures and fabrication steps in accordance with building a device in accordance with an aspect of the invention. As shown in FIG. 4a, a hardmask 30 is formed on the structure 10. In embodiments, the hardmask 30 can be deposited using conventional deposition methods such as, for example, chemical vapor deposition (CVD), plasma enhanced chemical vapor deposition (PECVD), etc. In embodiments, the hardmask 30 is an oxide material such as, for example, an undensified TEOS material, deposited to a thickness of about 200 nm to 3000 Å and more preferably between about 800 Å and 1000 Å. In an alternate embodiment, the hardmask can be a nitride hardmask deposited to a thickness of about 300 Å and 1000 Å.

A photoresist 32 is deposited on the hardmask 30, and patterned to form an opening 34, in alignment with a gate structure 16A. That is, the opening 34 is over a gate structure 16A and preferably exposing only a portion of each adjacent STI structures 17 (which may also be applicable to each of the embodiments described herein). In embodiments, the photoresist 32 covers approximately half of the adjacent STI structures 17; that is, only half of the adjacent STI structure 17 are exposed. The patterning of the photoresist 32 can be performed using conventional lithographic and etching processes.

As shown in FIG. 4b, after forming the opening 34, the hardmask 30 that is exposed through the opening 34 is etched or stripped using an isotropic etching technique to expose the underlying gate structure 16A. Thereafter, the hardmask 30 is subjected to an anisotropic etch, thereby providing a notch 46 or angle to the hardmask 30. In embodiments, the angle is less than 90° and more preferably about 45° or less.

In FIG. 4c, the photoresist is stripped away using any conventional etchant or other known stripping technique. This process leaves behind the hardmask 30 and exposed underlying gate structure 16A. A halo implant of, for example, $Bf_2$, can then be performed on the drain region 28 of the gate structure 16A. As the hardmask 30 is not very thick, compared to a resist used in conventional masking processes and provided at a steep angle, the halo implantation can be performed at an even shallower angle than previous embodiments discussed herein, with improved implant concentration. As previously discussed, advantageously, by using the hardmask 30 of the present invention, the implant will not be reflected back into the structure (as in the conventional structure from using a thick resist), and especially on the source side of the device. This, in turn, improves design performance, as the halo implant for the drain will not affect the source implant.

As in the previous embodiments, the structure will include a halo implant 36 at the drain region 28 of the device 16A. To accomplish this, referring back to FIG. 1e, the hardmask can be stripped using conventional processes.

Figure 5A:
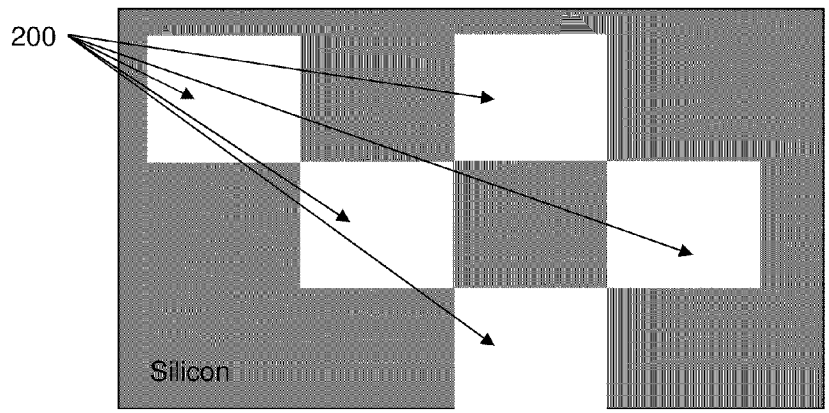
FIGS. 5a-5c show several structures and fabrication steps in accordance with building a device in accordance with an aspect of the invention.
Figure 5B:
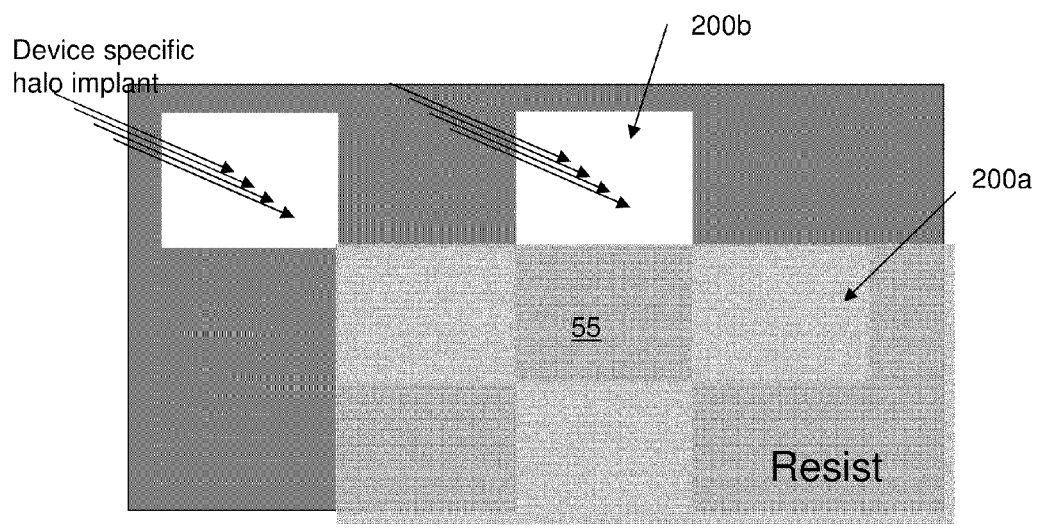
Figure 5C:
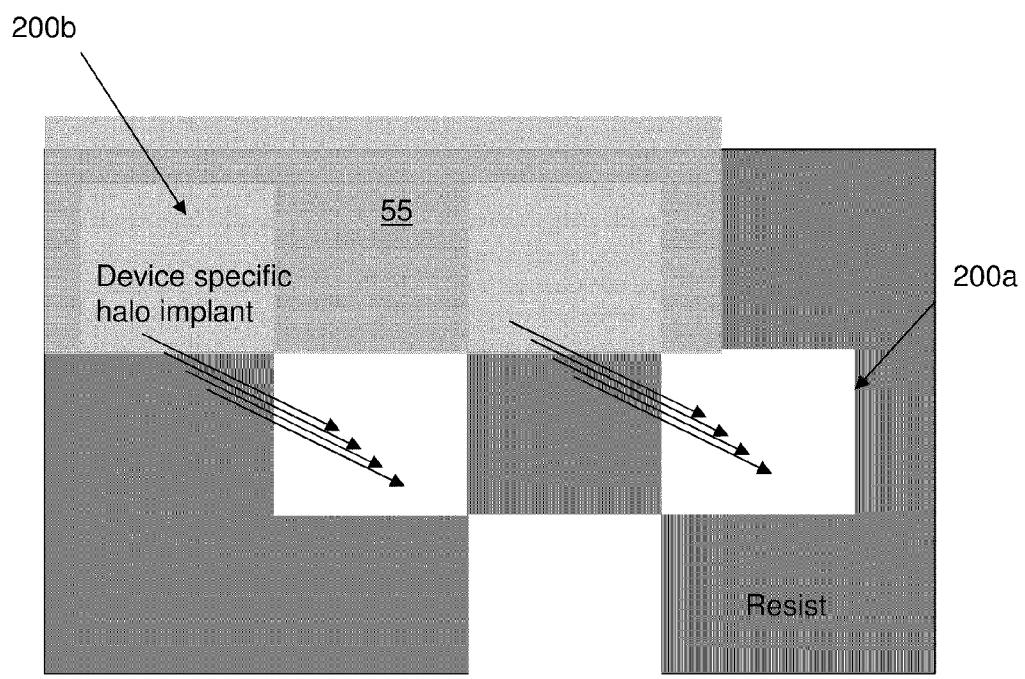

FIGS. 5a-5c show several top views and fabrication steps in accordance with building a device in accordance with an aspect of the invention. More specifically, FIG. 5a is representative of several exposed FETs 200 (which may be the exposed gates 16A of any of the above embodiments). In FIG. 5b, a resist 55 is placed over selected FETs 200a in order to protect them during a selective halo implantation process. For example, the FETs 200a may be NFETS that are protected during a halo implant of exposed PFETs 200b. FIG. 5c, on the other hand, shows the resist over FETs 200b, while the FETs 200a are exposed. In this way, a halo implant can now be performed on different FETs, in accordance with aspects of the invention.

Figure 6:
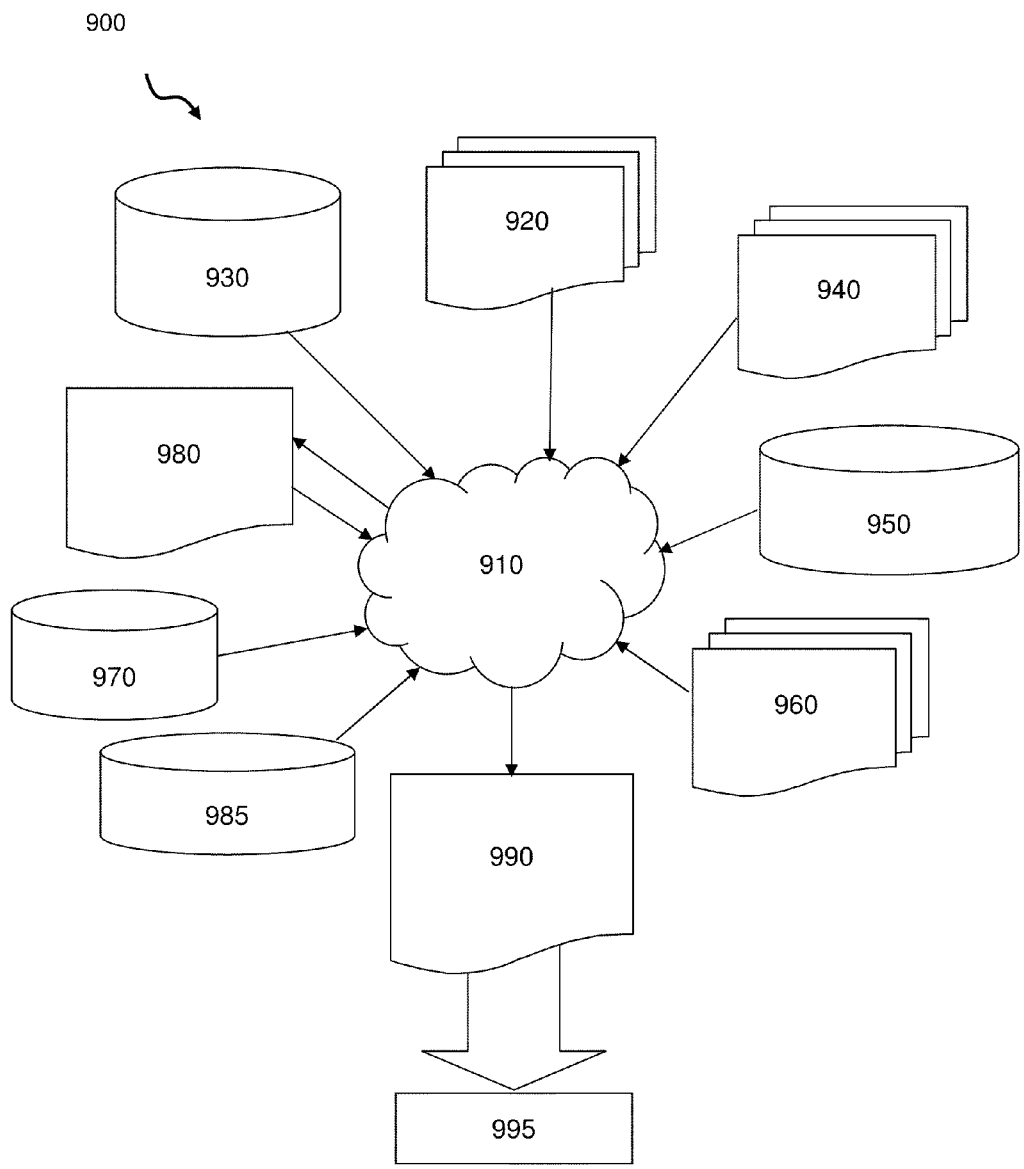
FIG. 6 is a flow diagram of a design process used in semiconductor design, manufacture, and/or test.

FIG. 6 is a flow diagram of a design process used in semiconductor design, manufacture, and/or test. FIG. X shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a-5c. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-5c. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-5c to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-5c. In one embodiment, design structure 990 may comprise a compiled, executable HDL simulation model that functionally simulates the devices shown in FIGS. 1a-5c.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-5c. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming a hardmask comprising at least a first material over one or more gate structures and its associated drain and source regions thereof;
   forming a photoresist over the hardmask;
   forming an opening in the photoresist over at least one of the gate structures, wherein the opening extends over the at least one of the gate structures and its associated drain and source regions thereof;
   stripping all of the first material of the hardmask that is exposed in the opening and which is over the at least one of the gate structures and its associated drain and source regions thereof;
   removing the photoresist; and
   providing an asymmetric halo implant on a side of the at least one of the gate structures,
   wherein:
      the first material is an oxide;
      the hardmask further comprises a second material, which is a nitride;
      the first material is located over the second material;
      the stripping includes stripping all of the oxide exposed in the opening in order to expose the nitride over the at least one of the gate structures and its associated drain and source regions thereof; and
      the nitride is formed with a thickness of about 25 nm to 100 nm and the oxide is formed with a thickness of about 300 Å to 1000 Å such that an incident angle of the asymmetric halo implant at less than 40° is configured to provide the asymmetric halo implant only on the drain side of the at least one of the gate structures through the exposed nitride.

2. The method of claim 1, wherein the asymmetric halo implant is provided through the nitride.

3. The method of claim 1, wherein the stripping includes stripping the oxide and the nitride, using the oxide as a hardmask, to expose the at least one of the gate structures, and the asymmetric halo implant is provided on the exposed gate structure.

4. The method of claim 1, further comprising notching the hardmask with an anisotropic etch prior to the asymmetric halo implant.

5. The method of claim 4, wherein the notching occurs prior to the removal of the photoresist.

6. A method, comprising:
   forming a plurality of gate structures on a substrate;
   forming a hardmask comprising a first material over all of the plurality of gate structures and their associated drain and source regions;
   forming a photoresist over the hardmask;
   forming an opening in the photoresist that is in alignment with the gate structure and its associated drain and source regions thereof, wherein the gate structure is one gate structure of the plurality of gate structures;
   stripping all of the first material of the hardmask that is exposed in the opening in the photoresist over the gate structure and its associated drain and source regions thereof;
   removing all of the photoresist over the hardmask; and
   providing an asymmetric halo implant on a side of the gate structure after the removing the photoresist,
   wherein the hardmask is an oxide formed with a thickness of about 300 Å to 1000 Å such that an incident angle of the asymmetric halo implant at less than 40° is configured to provide the asymmetric halo implant only on the one side of the gate structure.

7. The method of claim 6, wherein the stripping includes stripping the oxide, and the asymmetric halo implant is provided on an exposed gate structure.

8. The method of claim 6, further comprising notching the hardmask with an anisotropic etch prior to the removal of the photoresist and prior to the asymmetric halo implant.

9. The method of claim 8, wherein the notches allow for a shallow asymmetric halo implant, compared to the hardmask without notches.

\* \* \* \* \*